United States Patent
Sommer et al.

(10) Patent No.: US 7,337,345 B2
(45) Date of Patent: Feb. 26, 2008

(54) INPUT CIRCUIT FOR AN ELECTRONIC CIRCUIT AND A METHOD FOR CONTROLLING THE READING-IN OF A DATA SIGNAL

(75) Inventors: Michael Sommer, Raubling (DE); Rory Dickman, Graz (AT)

(73) Assignee: Infineon Technologies AG, Munich (DE)

( * ) Notice: Subject to any disclaimer, the term of this patent is extended or adjusted under 35 U.S.C. 154(b) by 387 days.

(21) Appl. No.: 11/087,976

(22) Filed: Mar. 22, 2005

(65) Prior Publication Data
US 2005/0225357 A1    Oct. 13, 2005

(30) Foreign Application Priority Data
Mar. 22, 2004   (DE) ............... 10 2004 013 929

(51) Int. Cl.
*G06F 1/12* (2006.01)
(52) U.S. Cl. ............... 713/401; 713/400; 713/503; 713/600; 365/189.01; 326/93; 326/94
(58) Field of Classification Search ............... 713/401
See application file for complete search history.

(56) References Cited

U.S. PATENT DOCUMENTS

| | | | |
|---|---|---|---|
| 5,946,712 A * | 8/1999 | Lu et al. ............... | 711/167 |
| 5,948,083 A * | 9/1999 | Gervasi ............... | 710/62 |
| 6,101,612 A * | 8/2000 | Jeddeloh ............... | 713/401 |
| 6,108,794 A * | 8/2000 | Erickson ............... | 713/401 |
| 6,429,693 B1 * | 8/2002 | Staszewski et al. ........... | 327/12 |
| 6,654,897 B1 * | 11/2003 | Dreps et al. ............... | 713/401 |
| 6,696,862 B2 | 2/2004 | Choi et al. | |
| 6,715,096 B2 * | 3/2004 | Kuge ............... | 713/600 |
| 7,031,420 B1 * | 4/2006 | Jenkins et al. ............... | 375/371 |
| 7,076,678 B2 * | 7/2006 | LaBerge ............... | 713/401 |
| 7,116,744 B2 * | 10/2006 | Saze et al. ............... | 375/371 |
| 7,209,531 B1 * | 4/2007 | Katz et al. ............... | 375/371 |
| 2002/0196868 A1 | 12/2002 | Ruckerbauer et al. | |
| 2004/0108877 A1 * | 6/2004 | Cho et al. ............... | 327/158 |

FOREIGN PATENT DOCUMENTS

DE    101 30 361 A1    1/2003

OTHER PUBLICATIONS

German Patent Office Examination Report dated Jan. 24, 2005.

* cited by examiner

*Primary Examiner*—Nitin C. Patel
(74) *Attorney, Agent, or Firm*—Patterson & Sheridan, L.L.P.

(57) ABSTRACT

The invention relates to a method for controlling the reading-in of a data signal at an input of an electrical circuit to an input latch with the aid of a clock signal, with the data item, which is indicated by the data signal, being transferred to the input latch with a clock edge of the clock signal, with the clock edge of the clock signal being shifted in time as a function of a time delay between a signal edge of the input signal at the input and the clock edge, such that the time delay between the signal edge of the data signal and the clock edge is within a predetermined time window.

20 Claims, 2 Drawing Sheets

INPUT CIRCUIT FOR AN ELECTRONIC CIRCUIT AND A METHOD FOR CONTROLLING THE READING-IN OF A DATA SIGNAL

CROSS-REFERENCE TO RELATED APPLICATIONS

This application claims foreign priority benefits under 35 U.S.C. §119 to co-pending German patent application number DE 10 2004 013 929.6, filed 22 Mar. 2004. This related patent application is herein incorporated by reference in its entirety.

BACKGROUND OF THE INVENTION

1. Field of the Invention

The invention relates to a method for controlling the reading-in of a clock signal to an input latch with the aid of a clock signal, and to an input circuit for an electronic circuit.

2. Description of the Related Art

Data signals are first read into an input latch in an integrated circuit before the data item which is represented by the data signal is made available to an internal circuit. The data signal is transferred to the input latch with the aid of a clock signal which is synchronized to the data signal.

Particularly in the case of a dynamic random access memory (DRAM) circuit, data signals are transferred by means of trigger signals, such as the DQS signal, which indicate the time at which the applied data should be read into the input latch. The applied data is generally transferred with an edge of the DQS signal or the clock signal.

Typically, the time at which the data signal is read-in is determined by a fixed time delay between the signal edge of the data signal which occurs at the change of the data item and the clock edge of the clock signal (e.g., the DQS signal) by means of which the data item is transferred to the input latch. This time delay is permanently set by means of delay elements which cannot be adjusted and leads to even minor process changes shifting this time delay, so that the reading-in time no longer corresponds to the selected optimum value.

Furthermore, the applied data item should be read in as quickly as possible so that the longest possible time period is available for further processing of the data item stored in the input latch. Since two or more data items which are applied to inputs of the electronic circuit should be read in with the clock signal, it is possible for the time period between the data signal edge and the clock edge to be insufficiently long for a data item to be reliably transferred to the input latch. The clock signal is thus set with respect to the signal edges of the data signals such that each of the data signals can be read in reliably. A sufficiently long time delay, which is defined in advance, is normally set between the signal edge of the data signal and of the clock signal for this reason in order to transfer each of the applied data signals reliably to the input latches with the greatest possible confidence. Consequently, subsequent circuits may have less time available to further process the input signal even though the data signals could have been transferred after a shorter delay time on a case-by-case basis.

Therefore, there is a need for a method as well as an input circuit to transfer data items which are applied to an input of an electronic circuit to an input latch as quickly as possible.

SUMMARY OF THE INVENTION

According to a first aspect of the present invention, a method is provided for controlling the reading-in of a data signal to an input latch with the aid of a clock signal. The data item which is indicated by the data signal is transferred to the input latch with a clock edge of the clock signal. The clock edge of the clock signal is shifted in time as a function of a time delay between a signal edge of the data signal and the clock edge such that the time delay between the signal edge of the data signal and the clock edge is within a predetermined time window.

The method according to one embodiment of the invention thus provides for the clock signal for reading-in a data signal to be transferred to the input latch as a function of the time at which the signal edge is applied to the input of the electronic circuit. The clock edge is delayed or sped up in time such that the time period between the application of the signal edge to the input of the electronic circuit and the clock edge is within a predetermined time window. This ensures that the reading-in of the data signal is, on the one hand, set when the electronic circuit is operating such that the data signal is transferred in an optimum manner, and on the other hand, is continuously adapted during the operation of the electronic circuit such that timing changes in the data signal resulting from temperature dependencies, voltage variations and the like are compensated for.

According to a further embodiment, the clock edge may be adapted by quantizing the time delay between the signal edge of the data signal and the clock edge. The clock edge is delayed when the time delay is shorter than a first preset value for the time delay, and the clock edge is speeded up when the time delay is greater than a second preset value for the time delay. This represents one simple way for adaptation of the timing of the clock edge such that the time delay between the signal edge of the data signal and the clock edge is set within a predetermined time window.

The time delay between the signal edge of the data signal and the clock edge is quantized by forming two or more time windows through which the signal edge of the data signal passes with a time delay. The time window in which the signal edge currently passes through is defined at the time of the clock edge. The time window then indicates a time period within which the time delay between the signal edge of the data signal and the clock edge is located.

According to a further embodiment, two or more data signals may be provided and read-in jointly with respect to the clock edge and with the clock edge of the clock signal being shifted in time as a function of the respective time delays between the signal edges of two or more data signals and the clock edge such that the clock edge is suitable for reading in each of the data signals. Thus, the clock signal for two or more data signals may be adapted, in particular, to ensure that the slowest data signal is reliably transferred to the input latch. In this context, in particular, the clock edge of the clock signal may be adapted as a function of the shortest time delay between the signal edges of the data signals and the clock edge, by delaying the clock edge.

According to a further aspect of the present invention, an input circuit is provided for an electronic circuit having an input latch for temporary storage of a data signal. The input latch accepts the data from the data signal which is applied to an input of the electronic circuit on the basis of a clock signal which is provided. The input circuit has a quantization circuit for quantizing the time delay between a signal edge of the data signal and a clock edge of the clock signal. The input circuit also has a matching circuit for the clock signal to adapt the clock edge of the clock signal as a function of the quantized time delay, such that the time delay between the signal edge of the data signal and the clock edge is within a predetermined time window.

With the input circuit according to the invention, which is self-adapting such that an applied data signal can always be transferred in an optimum manner with the clock edge of a clock signal to an input latch, it is possible on the one hand for design influences on the overall system to be compensated for by the data signal being applied to the input of the electronic circuit with a delay or an acceleration (i.e., being speeded up), or to compensate for operational influences, such as temperature and voltage variations and the like. The optimum time of the clock signal with respect to the data signal is thus always sought to transfer the data signal to the input latch.

According to one embodiment, the quantization circuit may be connected to delay elements which provide a first delayed data signal and a second delayed data signal. The first and the second delayed data signal form the predetermined time window. The matching circuit is designed to shift the clock edge in time when the time delay between the clock edge and the signal edge of the data signal which is applied to the input of the electronic circuit is outside the predetermined time window. Delay elements may be used in a simple manner to construct a time window to determine whether a time delay between two signal edges is within a specific time period.

One of the delay elements may be provided to produce a third delayed data signal to form a further time window together with the first or second delayed data signal, with the matching circuit being designed to shift the timing of the clock edge such that the time delay between the clock edge and the signal edge is moved in the direction of the predetermined time window when the time delay between the signal edge and the clock edge is within the further time window.

Two or more quantization circuits may be provided for two or more data signals to quantize the time delays between the signal edges of the data signals and the clock edge of the clock signal. The matching circuit is then designed to adapt the timing of the clock edge of the clock signal as a function of the time delays. In particular, the matching circuit may be designed to adapt the clock edge of the clock signal as a function of the shortest time delay between the signal edges of the data signals and the clock edge.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
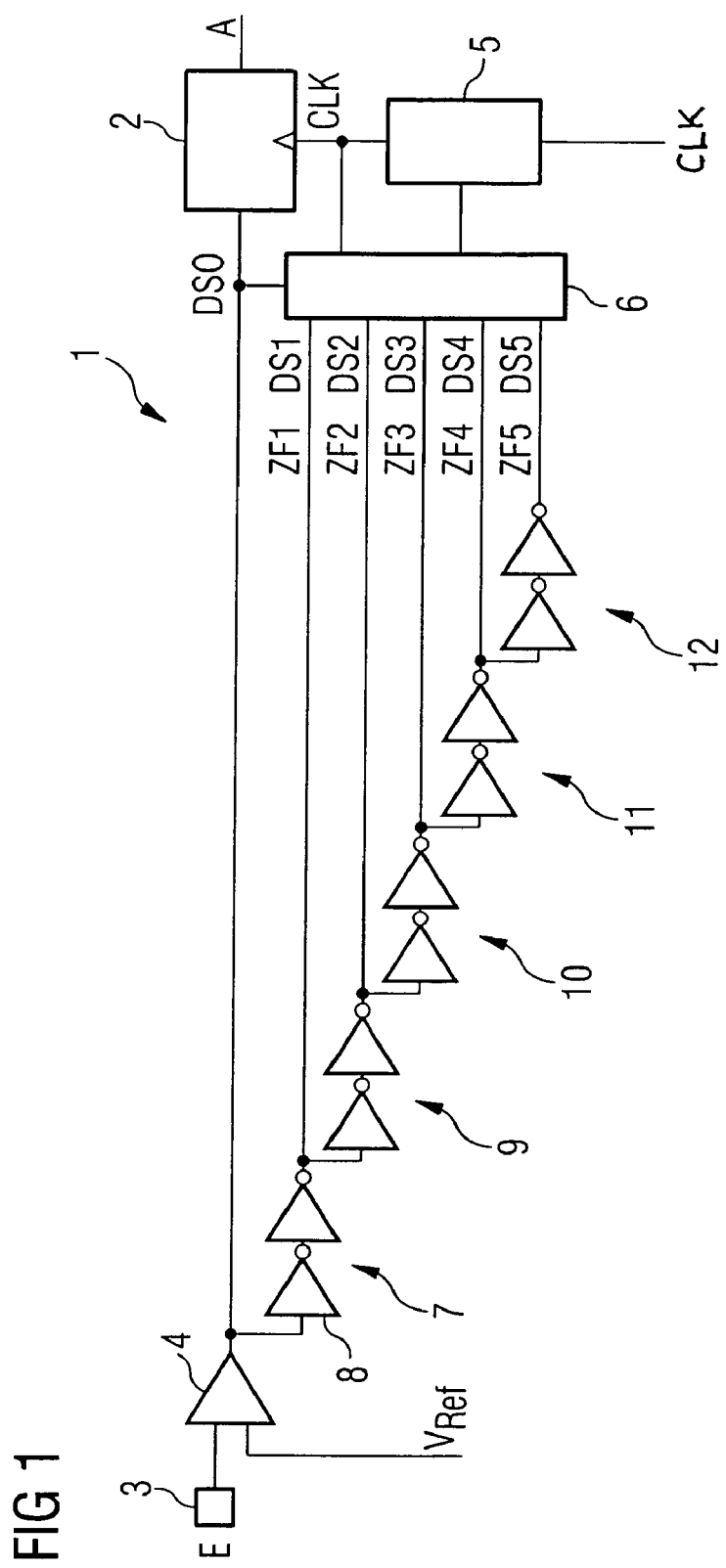
FIG. 1 shows an input circuit according to a first embodiment of the invention.

FIG. 1 shows an input circuit for an electronic circuit 1 for reception of an input signal which is applied to the input E, and for provision of the data item, which is represented by the input signal, to an input latch 2. In particular, the electronic circuit may be in the form of an integrated circuit, for example, as an integrated memory circuit having two or more data inputs and outputs. The input signal, which is applied to an input connection 3 of the electronic circuit, is supplied to a first input of a differential amplifier 4 to assess the applied data signal and to determine its state level. A reference voltage $V_{Ref}$ is supplied to a second input of the differential amplifier 4 and is used to assess the signal level of the input signal E. For this purpose, the signal level is compared with the reference voltage $V_{Ref}$, and a first signal level is emitted at the output of the differential amplifier 4 when the signal level of the input signal is greater than the reference voltage $V_{Ref}$, and a second signal level is emitted when the input signal level is less than the reference voltage $V_{Ref}$.

The output of the differential amplifier 4 is connected to a data input of the input latch 2. A signal level which is applied there is transferred as a function of a clock edge of a clock signal CLK. This means that, at the time at which the relevant clock edge is applied to the clock input of the input latch 2, the data signal must also be applied with its appropriate signal level to the input of the input latch 2 to transfer the data item which is represented by the input signal to the input latch 2. As soon as the data item has been transferred to the input latch 2, the corresponding received data signal is produced at the output A of the input latch 2, and is then available for a downstream electronic circuit.

The clock signal and the data signal are normally synchronized to one another so that the data signal level is applied to the input of the input latch 2 when the clock edge arrives at the clock signal input to transfer the data signal to the input latch 2. If the electronic circuit has been provided in a larger overall system, then timing shifts may occur between the data signal and the clock signal as a result of system-dependent delays resulting from signal delay times or changes to the operating parameters, in particular such as the temperature, supply voltage variations and the like. This can lead to a situation, when the clock edge arrives at the input latch 2, of the data signal level which should be transferred with this clock edge not yet having been applied to the input of the input latch 2 or not yet having been applied to the input for long enough, so that the data item cannot be transferred to the input latch 2.

To preclude a fault such as described above, the timing between the data signal and the clock signal is normally designed such that the data item can be transferred to the input latch even in the worst case. This is normally achieved by applying the clock edge with a sufficiently long delay after the data signal edge to the input latch 2, so that, even if the data signal is delayed, the data signal is applied at its appropriate signal level to the input of the input latch 2 when the clock edge arrives. However, to provide more time for the downstream electronic circuit to read the data item from the input latch 2 and to process it further, it is desirable for the applied data signal to be interpreted as quickly as possible and for the corresponding data item to be read to the input latch 2 as quickly as possible.

A time matching circuit 5 is provided for this purpose, which changes the time reference of the clock signal CLK.

The time matching circuit 5 is able to shift the relevant edges of the clock signal backwards or forwards in time to provide a desired time reference between the data signal and the corresponding clock edges for transferring the data item to the input latch 2. In one embodiment, the matching circuit may adjust the time delay between the signal edge of the data signal and the clock edge to be within a predetermined time window.

The time matching circuit 5 receives from a quantization circuit 6 a statement as to the time period, that is to say the time window, in which the time delay between the clock edge and the data signal edge is located. For this purpose, the data signal DS0, a first delayed data signal DS1, a second delayed data signal DS2, a third delayed data signal DS3, a fourth delayed data signal DS4 and a fifth delayed data signal DS5 are applied to the quantization circuit 6. The first delayed data signal DS1 is produced by a first delay element 7, which is formed from two series-connected inverters 8. The first delayed data signal DS1 is tapped off at the output of the first delay element 7. The output of the first delay element 7 is applied to an input of the second delay element 9. The output of the second delay element 9 produces the second delayed data signal DS2. The output of the second delay element 9 is connected to an input of a third delay element 10, whose output produces the third delayed data signal DS3 and is connected to a fourth delay element 11. The fourth delayed data signal DS4 is produced at the output of the fourth delay element 11. The output of the fourth delay element 11 is once again connected to a fifth delay element 12, at whose output the fifth delayed data signal can be tapped off. The first to fifth delay elements may be designed substantially identically with inverter chains, thus resulting in substantially identical delay times between the respectively successive delayed data signals.

The data signal and the delayed data signals define time windows ZF in the quantization circuit 6, with the data signal DS0 and the first delayed data signal DS1 forming a first time window ZF1, the first delayed data signal DS1 and the second delayed data signal DS2 forming a second time window ZF2, the second delayed data signal DS2 and the third delayed data signal DS3 forming a third time window ZF3, etc.

The quantization circuit 6 likewise receives the clock signal CLK and determines in which of the defined time windows ZF1 to ZF5 an edge of a data signal is located when the corresponding clock edge is applied to the quantization circuit 6 to transfer the data signal. Since the data signal edge passes through the time windows ZF successively, it is possible, by stating the time window, to specify the time period in which the time delay between the data signal edge and the clock edge is located. A statement of the corresponding time window, in which the data signal edge is located when the clock edge is applied to the quantization circuit 6, is applied to the time matching circuit 5. The time matching circuit 5 provides whether the clock signal is not delayed, is delayed or is speeded up as a function of the specific time window ZF.

Since the input latch 2 has a set-up time (i.e., a time during which the data signal must be applied at one level to the input of the input latch 2 before it can be transferred by means of an appropriately applied clock edge), a time delay is necessary between the data signal edge and the clock edges. For example, assuming that there is optimum matching between the data signal edge and the clock edge when the quantization circuit 6 determines that the data signal edge is located in the third time window ZF3 when the clock edge is applied to the quantization circuit 6, it would be necessary to delay the clock signal if during operation the data signal edge was located in the second time window ZF2 when the clock edge was applied. It would be necessary to speed up the clock signal if it were found that the data signal edge was already located in the fourth time window ZF4 when the clock edge was applied.

Thus, the clock signal may be matched to a data signal by simple means, with the clock edge always being set such that the time delay between a data signal edge and a clock edge is within a predetermined time window.

The time delay or speeding up of the clock signal, with which the time matching circuit 5 delays or speeds up the clock signal when the data signal edge is not located in the predetermined time window when the clock edge is applied to the quantization circuit 6, may be a time increment which is shorter than the time period of a time window. However, the time increment may be provided to correspond to the time interval between the mean values of the limit time periods, which are governed by the respective delayed data signals, of two adjacent time windows. Any time period may be chosen as the time increment, although the time increment should be no longer than the time period which is defined by a time window.

The delay elements 7, 9, 10, 11, 12 may be designed in any desired manner, i.e., with components other than inverters, to produce either a respectively identical signal delay or different signal delay times. In the present case, delay elements with identical signal delays have been chosen to allow uniform quantization of the time delay between the data signal edge and the clock edge.

Figure 2:
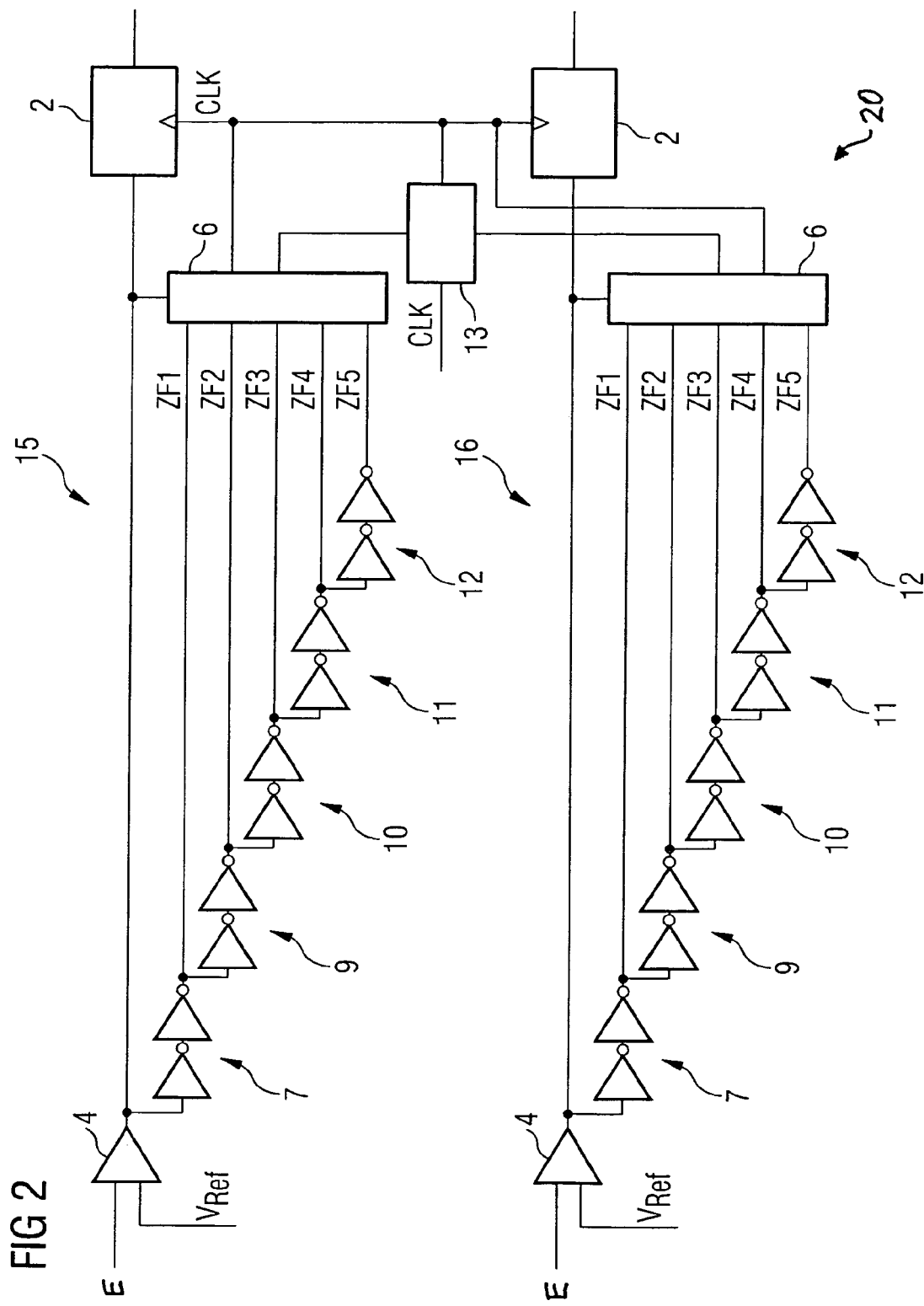
FIG. 2 shows an input circuit for two or more data signals according to a second embodiment of the present invention.

FIG. 2 shows an input circuit 20 according to a second embodiment of the invention having two inputs E for two data signals which are applied to the electronic circuit. The input circuit differs from the input circuit illustrated in FIG. 1 in that it is configured to receive two input data signals. As shown in FIG. 2, the input circuit comprises a first input circuit portion 15 and a second input circuit portion 16. Each input circuit portion includes a respective input E, a respective differential amplifier 4, a respective set of first to fifth delay elements 7, 9, 10, 11, 12, a respective quantization circuit 6, and a respective input latch 2. Elements with the same reference symbols indicate elements with the same function. Although the embodiment as shown includes two inputs, it is contemplated that the number of inputs is not restricted to two and may be any desired number. However, at least in one embodiment, only one time matching circuit 13 is provided, which is connected to both of the quantization circuits 6 in the two input circuit portions and receives a statement from each of the input circuit portions 15, 16 as to the time window in which the respective data signal edge at the respective input is located when the clock edge is applied to the respective quantization circuit 6. The time matching circuit 13 is designed such that the data signal which requires the greater delay (i.e., the data signal having the shorter time interval from the clock edge of the clock signal) is taken into account in every case by delaying the clock signal CLK to such an extent that a minimum time delay between that data signal edge with the greatest delay and the clock edge is sufficient for the data item in the delayed data signal to be transferred to the respective input latch 2.

For example, if the data signal edge of the first input circuit portion 15 is located in the second time window ZF2 and the data signal edge of the data signal in the second input circuit portion 16 is located in the third time window ZF3 from the clock signal when the clock edge arrives at the quantization circuit 6, then the clock signal is delayed such that the data signal edge of the data signal at the first input circuit portion 15 is delayed and becomes located in the third time window ZF3 when the next clock edge (or one of the next clock edges) is applied to the quantization circuit of the first input circuit portion 15.

If, conversely, it is found that the data signal edge at the first input circuit portion 15 is located in the third time window ZF3 and the data signal edge at the second input circuit portion 16 is located in the fourth time window ZF4, then the clock signal is speeded up so that the data in the data signals can be transferred to the input latches 2 more quickly. This makes it possible to transfer the data signals to the respective input latches 2 in an optimum manner with the aid of one clock signal, taking account of the slowest data signal. Since the clock signal is continuously matched to the time reference of the data signals with respect to the clock signal, the input circuit according to embodiments of the invention may take into account the variations in the environmental conditions, such as the temperature, voltage or signal path length, by delaying or speeding up the clock signal.

While the foregoing is directed to embodiments of the present invention, other and further embodiments of the invention may be devised without departing from the basic scope thereof, and the scope thereof is determined by the claims that follow.

What is claimed is:

1. A method for controlling reading-in of a data signal from an input of an electrical circuit to an input latch, comprising:
   generating a plurality of delayed data signals using the data signal, wherein each of the plurality of delayed data signals define a respective time window relative to the data signal;
   determining a time delay between a signal edge of the data signal at the input and a clock edge of a clock signal;
   adjusting the time delay between the signal edge of the data signal and the clock edge to be within one of the respective time windows; and
   transferring a data item indicated by the data signal to the input latch with the clock edge of the clock signal.

2. The method of claim 1, wherein adjusting comprises shifting the clock edge of the clock signal in time as a function of the time delay such that the time delay between the signal edge of the data signal and the shifted clock edge is within the predetermined time window.

3. The method of claim 2, wherein the shifting comprises at least one of:
   delaying the clock edge when the time delay is shorter than a first preset time delay value; and
   speeding up the clock edge when the time delay is greater than a second preset value for the time delay.

4. The method of claim 3, wherein determining the time delay comprises quantizing the time delay between the signal edge of the data signal and the clock edge.

5. The method of claim 4, wherein the time delay between the signal edge of the data signal and the clock edge is determined by forming two or more time windows and defining, at the time of the clock edge, which of the two or more windows the clock edge passes through.

6. The method of claim 2, wherein two or more data signals are input concurrently and wherein the clock edge of the clock signal is shifted in time as a function of respective time delays between respective signal edges of the two or more data signals and the clock edge.

7. The method of claim 6, wherein the clock edge of the clock signal is shifted as a function of a shortest time difference between the respective signal edges of the data signals and the clock edge, by delaying the clock edge a sufficient time period corresponding to the shortest time difference.

8. An input circuit for an electronic circuit, comprising:
   an input for receiving a data signal;
   an input latch for storing a data item in the data signal which is applied to the input on the basis of a clock signal which is provided;
   a quantization circuit for quantizing a time delay between a signal edge of the data signal and a clock edge of the clock signal; and
   a matching circuit for shifting the clock edge of the clock signal as a function of the quantized time delay, wherein the time delay between the signal edge of the data signal and the shifted clock edge is within a predetermined time window.

9. The input circuit of claim 8, further comprising:
   a plurality of delay elements connected to the quantization circuit, each delay element providing a delayed data signal, wherein the predetermined time window is formed by a first delayed data signal and a second delayed data signal.

10. The input circuit of claim 9, wherein the matching circuit is configured to shift the clock edge in time when the time delay between the clock edge and the signal edge of the data signal is outside the predetermined time window.

11. The input circuit of claim 10, wherein one of the delay elements produces a third delayed data signal for forming a further time window and wherein the matching circuit is configured to shift the clock edge in time such that, when the time delay between the signal edge of the data signal and the clock edge is within the further time window, the time delay between the shifted clock edge and the signal edge of the data signal is in the time window.

12. The input circuit of claim 8, wherein two or more quantization circuits are provided respectively for two or more data signals, each quantization configured to quantize a respective time delay between a respective signal edge of a respective data signal and the clock edge of the clock signal.

13. The input circuit of claim 12, wherein the matching circuit is configured to match the clock edge of the clock signal as a function of the respective time delays.

14. The input circuit of claim 13, wherein the matching circuit is configured to adapt the clock edge of the clock signal as a function of a shortest time delay between the respective signal edges of the respective data signals and the clock edge.

15. The input circuit of claim 8, wherein the matching circuit is configured to:
   delay the clock edge when the time delay is shorter than a first preset time delay value; and
   speed up the clock edge when the time delay is greater than a second preset value for the time delay.

16. An input circuit for an electronic circuit, comprising:
   a first input circuit portion comprising:
      a first input for receiving a first data signal;
      a first input latch connected to the first input, wherein a first data item in the first data signal is stored into the first input latch based on a matched clock signal;
      a first quantization circuit connected to the first input, the first quantization circuit configured to quantize a first time delay between a first signal edge of the first data signal and a clock edge of a clock signal; and
   a matching circuit connected to the first quantization circuit and the first input latch, the matching circuit configured to shift the clock edge of the clock signal as a function of the quantized first time delay and provide the matched clock signal to the first input latch, wherein a resultant time delay between the first signal edge of the first data signal and the shifted clock edge is within a predetermined time window.

17. The input circuit of claim 16, further comprising:
a plurality of delay elements connected to the first quantization circuit, each delay element providing a respective delayed first data signal, wherein a time window is formed between respective pairs of delayed first data signals.

18. The input circuit of claim 16, further comprising:
a second input circuit portion comprising:
  a second input for receiving a second data signal;
  a second input latch connected to the second input, wherein a second data item in the second data signal is stored into the second input latch based on the matched clock signal; and
  a second quantization circuit connected to the second input, the second quantization circuit configured to quantize a second time delay between a second signal edge of the second data signal and the clock edge of the clock signal,
wherein the matching circuit is connected to the second quantization circuit and the second input latch, the matching circuit configured to shift the clock edge of the clock signal as a function of the quantized first time delay and the quantized second time delay and to provide the matched clock signal to the first input latch and the second input latch, wherein the resultant time delay between the respective signal edges of the first and second data signals and the shifted clock edge is within the predetermined time window.

19. The input circuit of claim 18, wherein the matching circuit is configured to adapt the clock edge of the clock signal as a function of a shortest time delay between the respective signal edges of the respective data signals and the clock edge.

20. The input circuit of claim 19, wherein the matching circuit is configured to:
delay the clock edge when at least one of the first time delay and the second time delay is shorter than a first preset time delay value; and
speed up the clock edge when at least one of the first time delay and the second time delay is greater than a second preset value for the time delay.

* * * * *